US008754393B2

(12) United States Patent
Cao et al.

(10) Patent No.: US 8,754,393 B2
(45) Date of Patent: *Jun. 17, 2014

(54) DOUBLE CONTACTS FOR CARBON NANOTUBES THIN FILM DEVICES

(75) Inventors: Qing Cao, Yorktown Heights, NY (US); Aaron D. Franklin, Croton on Hudson, NY (US); Joshua T. Smith, Croton on Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/585,465

(22) Filed: Aug. 14, 2012

(65) Prior Publication Data
US 2014/0042392 A1    Feb. 13, 2014

Related U.S. Application Data

(63) Continuation of application No. 13/571,607, filed on Aug. 10, 2012.

(51) Int. Cl.
*H01L 47/00* (2006.01)

(52) U.S. Cl.
USPC ............. 257/4; 257/24; 257/66; 257/288; 257/457; 257/734; 257/748; 257/E29.081; 257/E29.242; 257/E29.245

(58) Field of Classification Search
USPC ............. 257/4, 24, 66, 288, 457, 734, 748, 257/E29.081, E29.242, E29.245
See application file for complete search history.

(56) References Cited

U.S. PATENT DOCUMENTS

| 7,960,713 | B2 | 6/2011 | Hunt et al. |
| 8,003,453 | B2 | 8/2011 | Avouris et al. |
| 2008/0293228 | A1 | 11/2008 | Kalburge |
| 2010/0127269 | A1 | 5/2010 | Daniel et al. |
| 2010/0224862 | A1 * | 9/2010 | Endoh et al. ............... 257/24 |
| 2012/0007054 | A1 | 1/2012 | Chang et al. |

OTHER PUBLICATIONS

J. Appenzeller, et al., "Optimized Contact Configuration for the Study of Transport Phenomena in Ropes of Single-Wall Carbon Nanotubes," Appl. Phys. Lett., vol. 78, 2001, pp. 3313-3315.
Q. Cao, et al., "Medium-Scale Carbon Nanotube Thin-Film Integrated Circuits on Flexible Plastic Substrates," Nature, vol. 454, Jul. 24, 2008, pp. 495-500.
M. Engel, et al., "Thin Film Nanotube Transistors Based on Self-Assembled, Aligned, Semiconducting Carbon Nanotube Arrays," ACS Nano, vol. 2, No. 12, 2008, pp. 2445-2452.
X. Ho, et al., "Scaling Properties in Transistors That Use Aligned Arrays of Single-Walled Carbon Nanotubes," Nano Letters, vol. 10, No. 2, 2010, pp. 499-503.
A. A. Bol, et al., "Semiconductor Device Including Graphene Layer and Method of Making the Semiconductor Device," U.S. Appl. No. 13/425,302, filed Mar. 20, 2012, not yet published.

* cited by examiner

*Primary Examiner* — Asok K Sarkar
(74) *Attorney, Agent, or Firm* — Cantor Colburn LLP; Vazken Alexanian

(57) ABSTRACT

A method of fabricating a semiconductor device is disclosed. A first contact layer of the semiconductor device is fabricated. An electrical connection is formed between a carbon nanotube and the first contact layer by electrically coupling of the carbon nanotube and a second contact layer. The first contact layer and second contact layer may be electrically coupled.

15 Claims, 3 Drawing Sheets

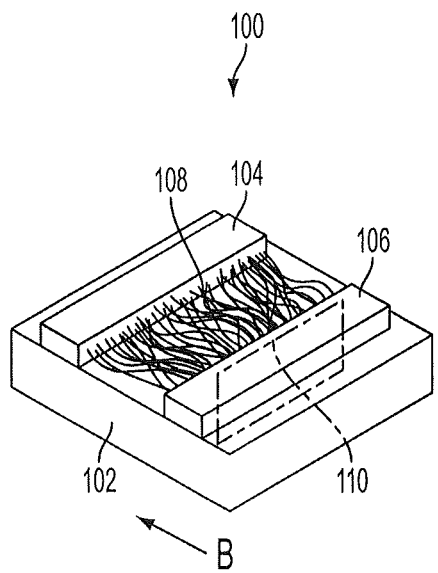
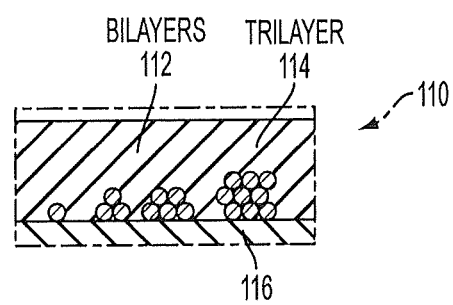
FIG. 1A
FIG. 1B
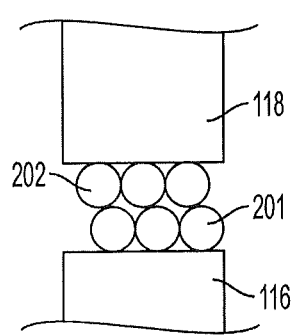
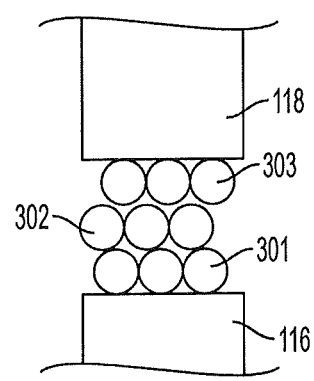
FIG. 2
FIG. 3

US 8,754,393 B2

DOUBLE CONTACTS FOR CARBON NANOTUBES THIN FILM DEVICES

CROSS-REFERENCE TO RELATED APPLICATIONS

This application is a Continuation of U.S. Non-Provisional application Ser. No. 13/571,607, entitled "DOUBLE CONTACTS FOR CARBON NANOTUBE THIN FILM DEVICES", filed on Aug. 10, 2012, which is incorporated herein by reference in its entirety.

BACKGROUND

The present disclosure relates to carbon nanotube devices and, in particular, to methods of fabricating a carbon nanotube transistor from a thin-film of nanotubes.

Carbon nanotubes (CNTs) are carbon allotropes that form a cylindrical structure. Semiconducting carbon nanotubes (CNTs) conduct exceptionally high currents with respect to their nanoscale diameter (e.g., 1-2 nanometers). Among their many uses, CNTs have been integrated into thin-film transistors (TFTs) which use CNTs to form gates of the transistor. The CNTs in these TFTs are generally not straight linear cylinders but rather have various bends and curves. Thus, when assembling a plurality of CNTs, the ends of the CNTs are generally not neatly aligned. This lack of alignment of the CNT ends introduces problems when attempting to electrically couple the CNTs to the various electrical contacts of the TFT. Consequently, there is generally a high contact resistance at interfaces between CNT and contacts in thin-film devices.

SUMMARY

According to one embodiment, a method of fabricating a semiconductor device includes: fabricating a first contact layer of the semiconductor device; and forming an electrical connection between a carbon nanotube and the first contact layer by electrically coupling of the carbon nanotube and a second contact layer to fabricate the semiconductor device.

According to another embodiment, a method of fabricating a transistor, includes: fabricating a first contact layer of at least one of a source and a drain of the transistor on a substrate; forming a second contact layer of the at least one of the source and the drain; and forming an electrical connection between a carbon nanotube and the first contact layer by electrically coupling the carbon nanotube to the second contact layer.

According to another embodiment, a method of forming a thin-film device includes: fabricating a contact on a thin-film substrate, wherein the contact includes a first contact layer and a second contact layer; and coupling a carbon nanotube to the second contact layer to provide an electrically connection between the first contact layer and the carbon nanotube.

Additional features and advantages are realized through the techniques of the present disclosure. Other embodiments and aspects of the disclosure are described in detail herein and are considered a part of the claimed disclosure. For a better understanding of the disclosure with the advantages and the features, refer to the description and to the drawings.

BRIEF DESCRIPTION OF THE SEVERAL VIEWS OF THE DRAWINGS

The subject matter which is regarded as the disclosure is particularly pointed out and distinctly claimed in the claims at the conclusion of the specification. The foregoing and other features, and advantages of the disclosure are apparent from the following detailed description taken in conjunction with the accompanying drawings in which:

FIG. 1A shows an exemplary carbon nanotube thin film device that may be fabricated using the methods disclosed herein;

FIG. 1B shows an exemplary sectional side view of the exemplary device of FIG. 1A.

FIG. 2 shows a carbon nanotube bilayer sandwiched between a bottom contact layer and a top contact layer;

FIG. 3 shows a carbon nanotube trilayer sandwiched between a bottom contact layer and a top contact layer;

DETAILED DESCRIPTION

Figure 4:
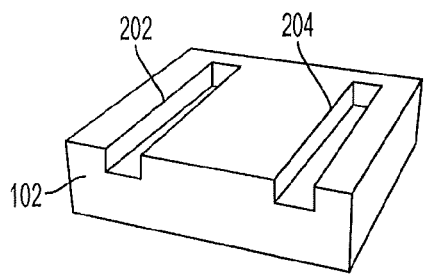
FIG. 4 shows an exemplary substrate that may be provided at a first step in a fabrication process of the present disclosure.

FIG. 1A shows an exemplary carbon nanotube (CNT) thin film device 100 that may be fabricated using the methods disclosed herein. In the illustrative example, the thin film device 100 is a thin-film transistor, such as a carbon nanotube thin-film transistor. The thin film device 100 may include a supporting substrate 102 that is generally an insulating substrate. Exemplary substrates may include silicon dioxide on silicon substrate, for example. In one embodiment, the substrate is a flexible substrate. Contacts 104 and 106 are formed on the substrate 102. In one embodiment, at least one of the contacts 104 and 106 may be formed on a surface of the substrate 102. In another embodiment, at least one of the contacts 104 and 106 may be formed in a trench formed in the substrate 102. For illustrative purposes, contact 104 is referred to herein as a source and contact 106 is referred to herein as a drain. However, it is understood that the contacts may be used for purposes other than as a source and a drain. A carbon nanotube layer 108 includes one or more CNTs that are configured to extend from the source 104 to the drain 106. The CNTs may be electrically coupled to the source 104 at one end of the CNT and to the drain 106 at an opposing end. In various embodiments, the carbon nanotubes generally do not extend along a straight line from source 104 to drain 106 but rather may include various bends and/or curves. Such curviness allows CNTs to maintain their structural and electrical integrity as the substrate flexes. However, this curviness makes it difficult to bond the CNT to contact surfaces, i.e., the surfaces of the source 104 and of the drain 106.

FIG. 1B shows an exemplary sectional side view 110 of the drain 106 as viewed along the direction line B indicated in FIG. 1A. The sectional side view 110 shows the ends of various carbon nanotubes of the CNT layer 108 disposed at the drain 106. Surface 116, also referred to herein as a first contact layer and a bottom contact layer, represents a coupling surface of the drain 106. Due to the curviness of the carbon nanotubes, the ends of the carbon nanotubes may pile up upon each other to form nanotube bilayers 112, trilayers 114 or multi-layers greater than three (not shown). For a bilayer 112, a bottom layer of the CNT bilayer 112 is in contact with the surface 116 while a top layer is away from the surface 116. In a trilayer, only one of the CNT layers (i.e., the bottom CNT layer) is in contact with surface 116, while two CNT layers are away from the surface. Therefore, generally only the CNTs at the bottom of the bilayer, trilayer, etc. may form a direct electrical coupling to surface 116. It is understood that a sectional side view of the drain may show CNT layering similar to that shown in the sectional side view of FIG. 1B.

As illustrated in FIG. 1B, even for a simple bilayer 112, there are a significant number of CNTs that are not in direct contact with the surface 116. The contact resistance increases with the number of CNTs not in direct contact with the contact surface. Increasing the number of CNTs that have an electrical contact to the surface therefore reduces contact resistance. A double-contact geometry provided herein is configured to increase the number of CNTs having an electrical contact to the surface, thereby reducing contact resistance. The exemplary double-contact geometry includes a second contact layer that is coupled to at least some of the CNTs that are not in direct contact with the first contact layer, as shown in FIGS. 2 and 3.

FIG. 2 shows a CNT bilayer 112 sandwiched or enclosed between a first contact layer 116 and a second contact layer 118. The first contact layer 116 may be a bottom contact layer and the second contact layer 118 may be a top contact layer. The ends of the CNTs are sandwiched or enclosed between the top contact layer 116 and the bottom contact layer 118, as discussed below. The CNT ends at the bottom layer 201 of the bilayer are electrically coupled to the bottom contact layer 116 and the CNT ends at the top layer 202 of the bilayer are electrically coupled to the top contact layer 118. FIG. 3 shows a CNT trilayer 114 sandwiched or enclosed between bottom contact layer 116 and top contact layer 118. The CNT ends at the bottom layer 301 of the trilayer are electrically coupled to the bottom contact layer 116. The CNT ends at the top layer 303 of the trilayer are electrically coupled to the top contact layer 118. The CNTs of middle layer 302 may or may not form an electrical coupling to either the bottom contact layer 116 or the top contact layer 118. Nonetheless, for a CNT bilayer, trilayer or higher number of CNT layers, the contact design disclosed herein increases the number of CNTs having an electrical coupling to the selected contact. Thus, the contact design of the present disclosure reduces a contact resistance between the CNTs and the contacts. Though not shown in FIGS. 2 and 3, first contact layer 116 and second contact layer 118 may be form an electrical contact or be otherwise electrically coupled.

FIGS. 4-8 illustrate an exemplary process for fabricating the exemplary thin-film device of FIG. 1. FIG. 4 shows an exemplary substrate 102 that may be provided at a first step in the fabrication process. In various embodiments, the substrate 102 may be a silicon-based substrate 102. Trenches 202 and 204 may be formed in the substrate using various etching techniques, for example.

Figure 5:
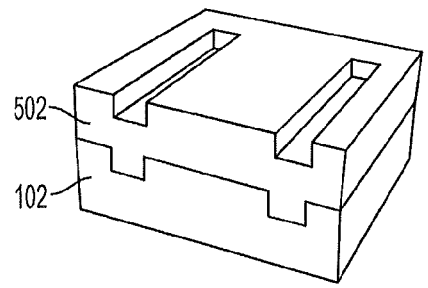
FIG. 5 illustrates a metallic layer formed on the substrate of FIG. 4.

FIG. 5 illustrates a metallic layer 502 formed on the substrate 102 for formation of contacts in the substrate 102. The metallic layer 502 may be deposited on the substrate 102 using various methods, including chemical vapor deposition, etc. The metallic layer 502 may then be polished in order to form bottom contact layers 514 and 516 (see FIG. 6) in the trenches 202 and 204. In an exemplary embodiment, the exposed surfaces of the bottom contact layers 514 and 516 are substantially coplanar with the substrate surface. In an alternate embodiment, the bottom contact layers may rest on a surface of the substrate 102 (i.e., are not embedded therein), as shown in FIG. 1A, for example.

Figure 6:
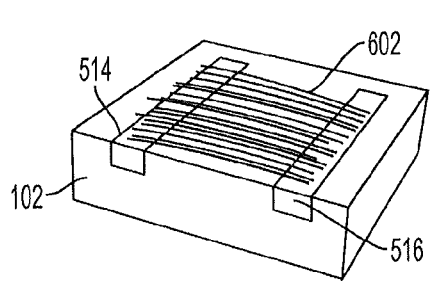
FIG. 6 shows carbon nanotubes placed along the substrate of FIG. 5 such that ends of the carbon nanotubes overlap bottom contact layers formed in the substrate.

FIG. 6 shows CNTs 602 placed along the substrate 102 such that ends of the CNTs 602 overlap the bottom contact layers 514 and 516 formed in the substrate 102. The CNTs 602 extend across a section of the substrate 102 between the bottom contact layers 514 and 516 so that one end of a selected CNT extends to the bottom contact layer 514 and the other end of the selected CNT extends to the bottom contact layer 516. The selected CNT may be configured to form a direct electrical connection with the bottom contact layers 514 and 516 or may be positioned away from the bottom contact layers, as illustrated in FIG. 1B, for example.

Figure 7:
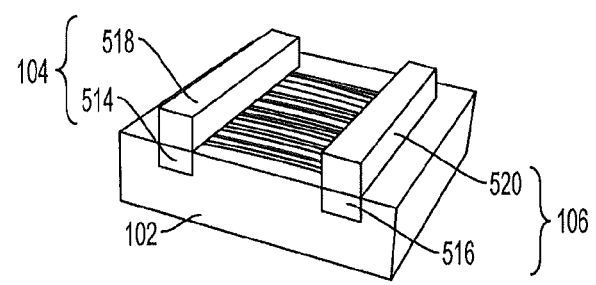
FIG. 7 illustrates formation of contacts having a double-contact geometry according to an exemplary embodiment.

FIG. 7 illustrates formation of contacts having a double-contact geometry according to an exemplary embodiment. Contact 104 includes bottom contact layer 514 and top contact layer 518. Contact 106 includes bottom contact layer 514 and top contact layer 520. Top contact layer 518 is placed on top of the ends of the CNTs and the bottom contact layer 514 in order to form an electrical coupling between the CNTs and the bottom contact layer 514. In particular, the top contact layer 518 forms an electrical coupling to both bottom contact layer 514 and to the CNTs that are away from the bottom contact layer 514, thus completing an electrical connection between the bottom contact layer 514 and the CNTs away from the bottom contact layer 514. Similarly, top contact layer 520 is coupled to bottom contact layer 516 to provide an electrical coupling between the bottom contact layer 516 and the CNTs away from the bottom contact layer 516.

Figure 8:
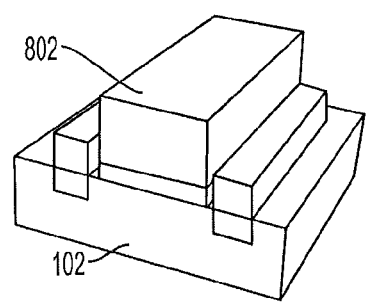
FIG. 8 shows a completion stage of an exemplary thin-film device.

FIG. 8 shows a completion stage of the exemplary thin-film device. A gate structure 802 is formed on the portion of the CNTs between the source 104 and drain 106. Voltages at the gate structure 802 are used to implement the CNTs as gates of the transistor. Electrodes and/or wires (not shown) may be connected to the source 104, drain 106 and gate 802 to provide operation of the transistor.

Figure 9:
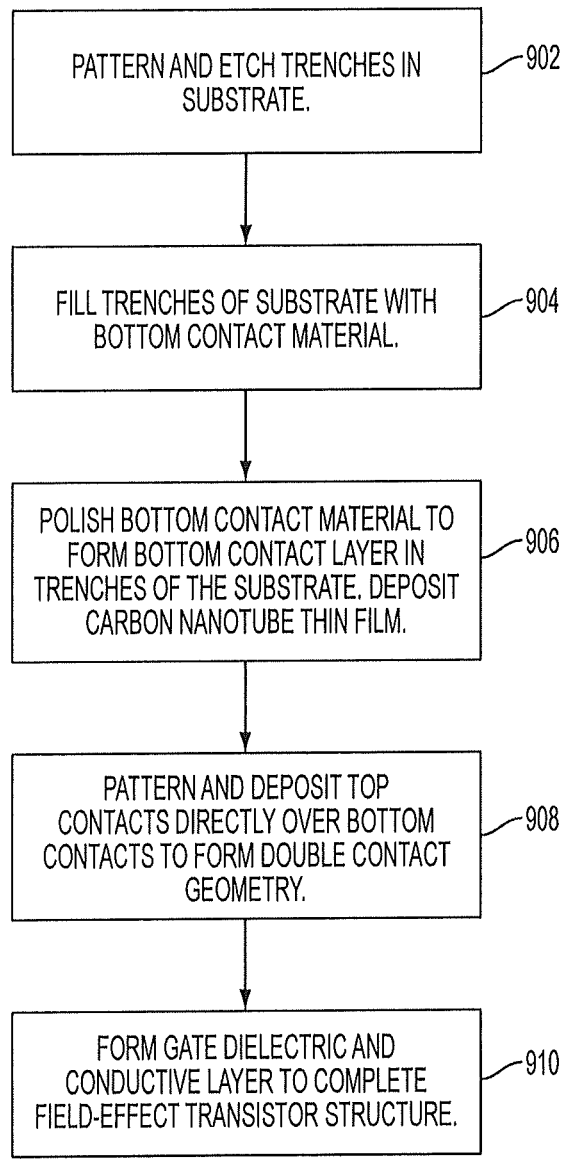
FIG. 9 shows a flowchart illustrating a method of fabricating a carbon nanotube field effect transistor according to an exemplary embodiment.

FIG. 9 shows a flowchart illustrating a method of fabricating a CNT thin-film field effect transistor according to an exemplary embodiment. In box 902, at least one trench is etched into a substrate. In box 904, the at least one trench is filled with a bottom contact material. In box 906, the bottom contact material is polished to provide a bottom contact layer, wherein the bottom contact layer and the substrate may be substantially coplanar. In box 908, carbon nanotubes are places along the substrate to extend between bottom contact layers. In box 908, for a selected contact, a top contact layer is deposited on a bottom contact layer to form a double contact geometry that sandwiches the CNTs. In general, a coupling surface of the top contact layer has substantially the dimensions of the coupling surface of the bottom contact layer. The top contact layer forms an electrical coupling to various CNTs that extend away from the bottom contact layer and also forms an electrical coupling to the bottom contact layer, thereby creating an electrical path between the various extended CNTs and the bottom contact layer. In box 910, a gate dielectric and conductive layer are formed at the CNT layer to complete a field-effect transistor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

The flow diagrams depicted herein are just one example. There may be many variations to this diagram or the steps (or operations) described therein without departing from the spirit of the disclosure. For instance, the steps may be performed in a differing order or steps may be added, deleted or modified. All of these variations are considered a part of the claimed disclosure.

While exemplary embodiments of the disclosure have been described, it will be understood that those skilled in the art, both now and in the future, may make various improvements and enhancements which fall within the scope of the claims which follow. These claims should be construed to maintain the proper protection for the disclosure first described.

What is claimed is:

1. A semiconductor device, comprising
   a first contact layer;
   a plurality of carbon nanotubes, wherein ends of the plurality of carbon nanotubes form multiple layers at the first contact layer; and
   a second contact layer configured to sandwich the ends of the plurality of carbon nanotubes between the first contact layer and the second contact layer and to form an electrical connection with the first contact layer.

2. The semiconductor device of claim 1, wherein the multiple layers form at least a bilayer of carbon nanotubes.

3. The semiconductor device of claim 2, wherein second contact layer is configured to reduce an electrical contact resistance between the first contact layer and the plurality of carbon nanotubes.

4. The semiconductor device of claim 1, wherein the first contact layer is at least one of a source and a drain of the semiconductor device.

5. The semiconductor device of claim 1 wherein the first contact layer is configured to be disposed at one of: in a trench of a substrate; and on a surface of the substrate.

6. The semiconductor device of claim 5, wherein the substrate further comprises a flexible substrate.

7. A transistor, comprising:
   a first contact layer of the transistor formed on a substrate;
   a plurality of carbon nanotubes, wherein ends of the plurality of carbon nanotubes form multiple layers at the first contact layer; and
   a second contact layer configured to sandwich the ends of the plurality of carbon nanotubes between the first contact layer and the second contact layer and to form an electrical connection with the first contact layer, wherein the first contact layer and the second contact layer form one of a source and a drain of the transistor.

8. The transistor of claim 7, wherein the first contact layer is configured to be disposed at one of: in a trench of the substrate; and on a surface of the substrate.

9. The transistor of claim 7, wherein the substrate further comprises a flexible substrate.

10. The transistor of claim 7, wherein the carbon nanotube is configured to be coupled to the second contact layer to reduce an electrical contact resistance of the one of the source and drain.

11. A thin-film device, comprising:
    a contact on a thin-film substrate, wherein the contact includes a first contact layer and a second contact layer; and
    a plurality of carbon nanotubes, wherein ends of the plurality of carbon nanotubes form multiple layers sandwiched between the first contact layer and the second contact layer, wherein the second contact layer forms an electrical connection with the first contact layer.

12. The device of claim 11, wherein the multiple layers form at least a bilayer of carbon nanotubes at the contact.

13. The device of claim 11, wherein the contact is at least one of a source and a drain of a carbon nanotube transistor.

14. The device of claim 11 wherein the first contact layer is configured to be disposed at one of: in a trench of the substrate; and on a surface of the substrate.

15. The device of claim 11, wherein the second contact layer forms the electrical connection with the first contact layer to reduce an electrical contact resistance between the contact and a carbon nanotube in a top layer of the multiple layers.

* * * * *